(12) United States Patent
Watanabe et al.

(10) Patent No.: US 8,928,136 B2
(45) Date of Patent: Jan. 6, 2015

(54) LEAD FRAME SEMICONDUCTOR DEVICE

(71) Applicant: Sony Corporation, Tokyo (JP)

(72) Inventors: Shinji Watanabe, Kagoshima (JP); Akihisa Eimori, Kagoshima (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/659,557

(22) Filed: Oct. 24, 2012

(65) Prior Publication Data

US 2013/0105957 A1    May 2, 2013

(30) Foreign Application Priority Data

Oct. 31, 2011  (JP) ................................. 2011-239444

(51) Int. Cl.
| | | |
|---|---|---|
| *H01L 23/48* | (2006.01) | |
| *H01L 23/52* | (2006.01) | |
| *H01L 23/495* | (2006.01) | |
| *H01L 21/00* | (2006.01) | |
| *H01L 23/00* | (2006.01) | |
| *H01L 21/56* | (2006.01) | |
| *H01L 23/31* | (2006.01) | |

(52) U.S. Cl.
CPC .......... *H01L 24/97* (2013.01); *H01L 23/49548* (2013.01); *H01L 23/49551* (2013.01); *H01L 21/561* (2013.01); *H01L 23/3107* (2013.01); *H01L 2224/32245* (2013.01); *H01L 2224/48137* (2013.01); *H01L 2224/48247* (2013.01); *H01L 2224/73265* (2013.01); *H01L 2224/97* (2013.01); *H01L 2224/45144* (2013.01)
USPC ........... 257/692; 257/676; 257/775; 438/121; 438/123; 438/127

(58) Field of Classification Search
USPC ........... 257/676, 692, 775; 438/121, 123, 127
See application file for complete search history.

(56) References Cited

U.S. PATENT DOCUMENTS

| | | | | |
|---|---|---|---|---|
| 5,084,753 A | * | 1/1992 | Goida et al. ................... | 257/685 |
| 5,936,303 A | * | 8/1999 | Nishi ............................. | 257/675 |
| 6,198,171 B1 | * | 3/2001 | Huang et al. .................. | 257/787 |
| 6,281,578 B1 | * | 8/2001 | Lo et al. ........................ | 257/724 |
| 6,528,868 B1 | * | 3/2003 | Weiblen et al. ............... | 257/669 |
| 6,646,339 B1 | * | 11/2003 | Ku et al. ....................... | 257/708 |
| 7,247,937 B2 | * | 7/2007 | Jiang et al. .................... | 257/691 |
| 7,301,225 B2 | * | 11/2007 | Wong et al. ................... | 257/666 |
| 7,323,769 B2 | * | 1/2008 | Tan et al. ....................... | 257/684 |
| 7,556,987 B2 | * | 7/2009 | Dimaano et al. .............. | 438/123 |
| 7,709,937 B2 | * | 5/2010 | Danno .......................... | 257/672 |
| 7,790,500 B2 | * | 9/2010 | Ramos et al. ................. | 438/106 |
| 2001/0035569 A1 | * | 11/2001 | Shibata ......................... | 257/667 |
| 2002/0084518 A1 | * | 7/2002 | Hasebe et al. ................ | 257/676 |
| 2002/0109214 A1 | * | 8/2002 | Minamio et al. .............. | 257/676 |
| 2003/0127711 A1 | * | 7/2003 | Kawai et al. .................. | 257/666 |
| 2004/0070056 A1 | * | 4/2004 | Matsuzawa et al. .......... | 257/666 |

FOREIGN PATENT DOCUMENTS

| | | |
|---|---|---|
| JP | 2006-222471 | 8/2006 |
| JP | 2009-278117 | 11/2009 |

\* cited by examiner

*Primary Examiner* — Karen Kusumakar
(74) *Attorney, Agent, or Firm* — Rader, Fishman & Grauer PLLC

(57) ABSTRACT

A lead frame includes: a chip-mounting region provided on a front surface; a lead region including a plurality of concave and convex sections arranged in an in-plane direction of the chip-mounting region; and a terminal arranged in the concave section. A thickness of the lead region from the front surface is smaller than a thickness of the terminal from the front surface.

17 Claims, 17 Drawing Sheets

LEAD FRAME SEMICONDUCTOR DEVICE

BACKGROUND

The present technology relates to a lead frame to which a chip such as a semiconductor chip is mounted and to a semiconductor device including the lead frame.

In recent years, for addressing miniaturization and higher density of electronic units, miniaturization of a package in which a chip such as a semiconductor chip is sealed with a resin has proceeded. Examples of forms of the foregoing package include a package using a lead frame. Examples of small-sized packages using the lead frame include a QFN (quad flat non-leaded package) and an SON (small outline non-leaded package). What we call a non-leaded package has attracted attentions.

In the package-type semiconductor device, a semiconductor chip is arranged in a chip-mounting region in the central portion of the lead frame, an electrode pad of the semiconductor chip is connected to an external terminal around the chip-mounting region, and a signal is thereby transmitted (for example, Japanese Unexamined Patent Application Publication Nos. 2009-278117 and 2006-222471). Further, by grounding (GND) the semiconductor chip, electric characteristics are stabilized.

SUMMARY

However, in the case where the semiconductor chip is grounded, if connection is made in a die pad (chip-mounting region) as in Japanese Unexamined Patent Application Publication No. 2009-278117, a connection region (bonding area) around the semiconductor chip is necessitated. Further, in Japanese Unexamined Patent Application Publication No. 2006-222471, since a GND terminal is arranged between mounted terminals, the number of external terminals around the semiconductor chip is increased by the number of GND terminals. That is, in both Japanese Unexamined Patent Application Publication Nos. 2009-278117 and 2006-222471, there has been a disadvantage that the package size of the semiconductor device is increased.

It is desirable to provide a lead frame capable of stabilizing electric characteristics by grounding a chip and reducing a package size, and a semiconductor device including the lead frame.

According to an embodiment of the present technology, there is provided a lead frame including: a chip-mounting region provided on a front surface; a lead region including a plurality of concave and convex sections arranged in an in-plane direction of the chip-mounting region; and a terminal arranged in the concave section. A thickness of the lead region from the front surface is smaller than a thickness of the terminal from the front surface.

According to an embodiment of the present technology, there is provided a semiconductor device including: a semiconductor chip; and a lead frame. The lead frame includes a chip-mounting region provided on a front surface, a lead region including a plurality of concave and convex sections arranged in an in-plane direction of the chip-mounting region, and a terminal arranged in the concave section. A thickness of the lead region from the front surface is smaller than a thickness of the terminal from the front surface. The semiconductor chip is mounted on the chip-mounting region, the semiconductor chip being electrically connected to the terminal through a first wiring and being electrically connected to the lead region through a second wiring.

In the lead frame and the semiconductor device according to the embodiments of the present technology, since the thickness of the lead region from the front surface is smaller than the thickness of the terminal from the front surface, at the time of packaging thereof, a rear surface of the lead region is covered with a sealing resin, and is not exposed from the sealing resin.

According to the lead frame and the semiconductor device according to the embodiments of the present technology, since the thickness of the lead region from the front surface is smaller than the thickness of the terminal from the front surface, the semiconductor chip is connected to a point having an electric potential different from that of the terminal, for example, is grounded without increasing the number of external terminals around the chip. Further, a bonding area is not necessarily provided in the chip-mounting region. Therefore, the chip is grounded, and the package size of the chip is miniaturized.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

An embodiment of the present technology will be hereinafter described in detail with reference to the drawings. The description will be given in the following order.
1. First Embodiment (example in which one semiconductor chip is included)
2. Modification 1 (example in which a plurality of semiconductor chips are included)
3. Modification 2 (example in which a plurality of lead frames are included)

Embodiment

Figure 1:
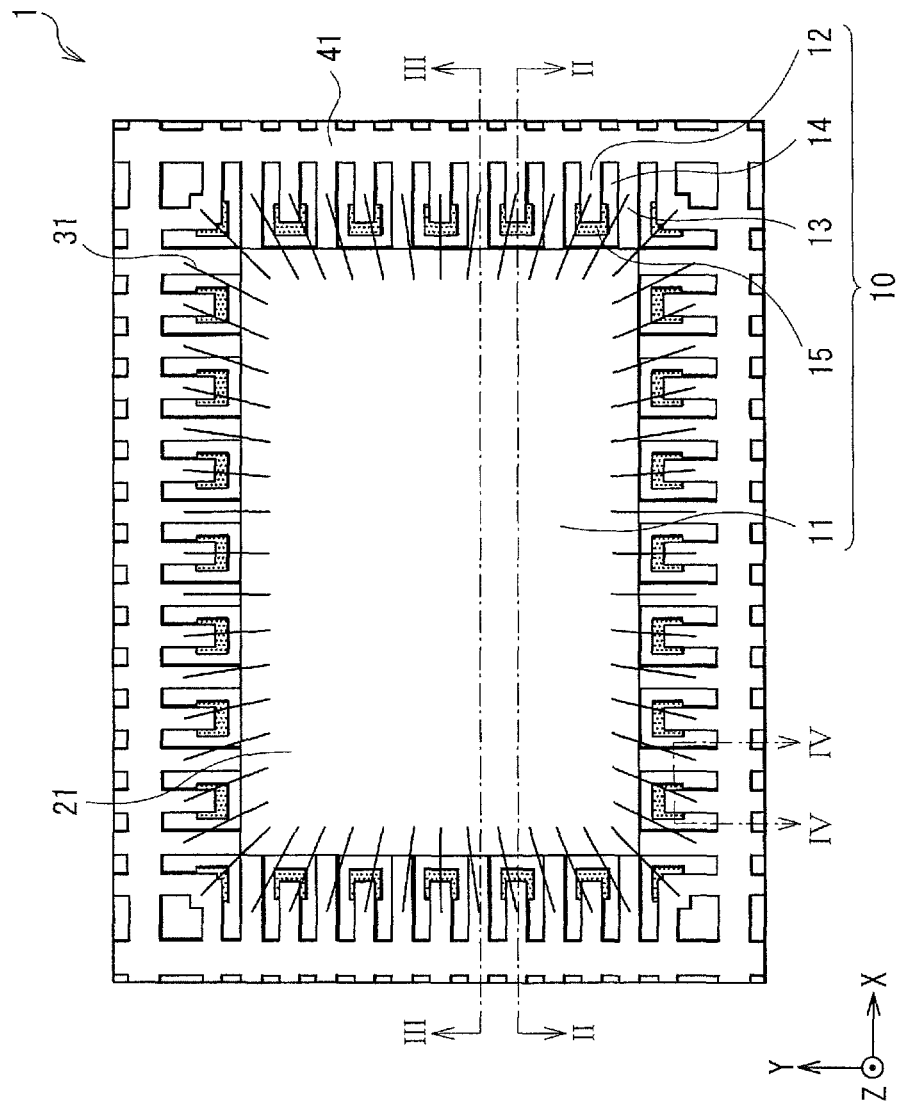
FIG. 1 is a plan view illustrating a configuration of a semiconductor device according to an embodiment of the present disclosure.
Figure 2:
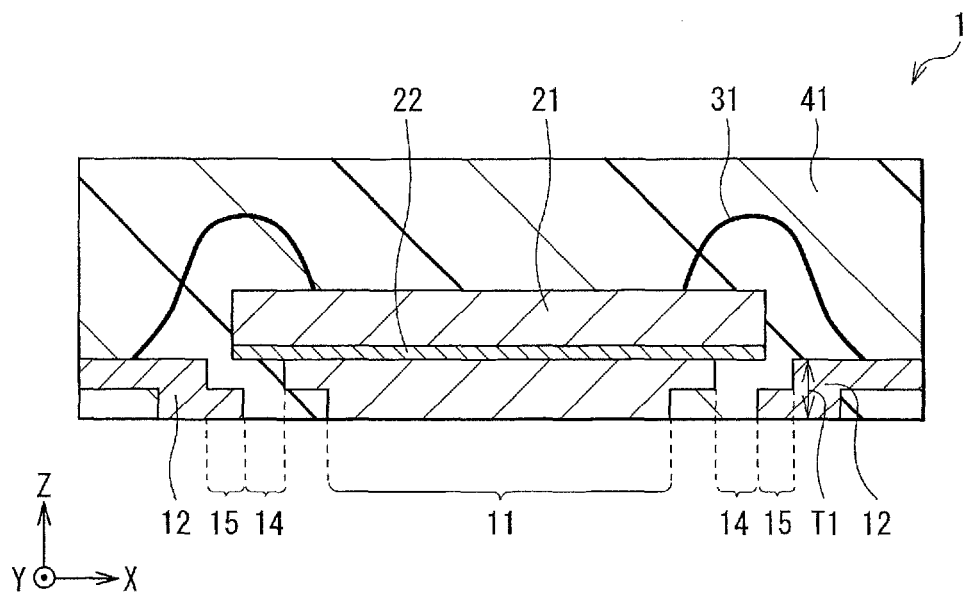
FIG. 2 illustrates a cross-sectional view taken along a line II-II of FIG. 1.
Figure 3:
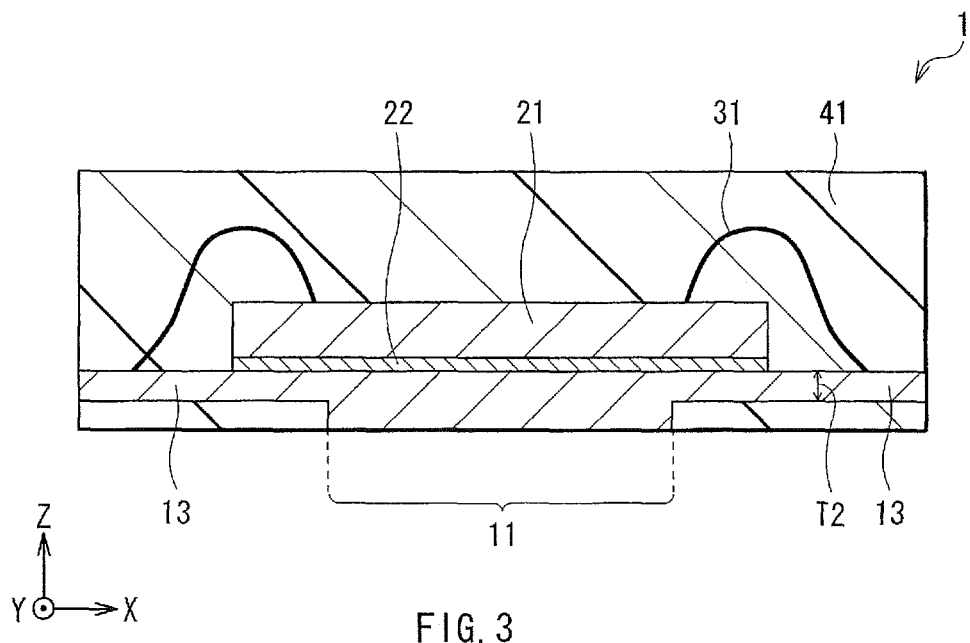
FIG. 3 illustrates a cross-sectional view taken along a line III-III of FIG. 1.
Figure 4:
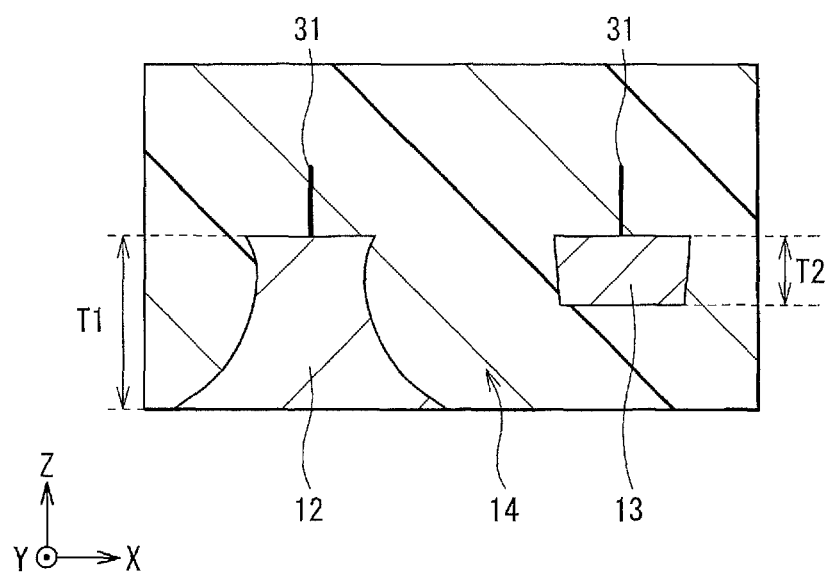
FIG. 4 illustrates a cross-sectional view taken along a line IV-IV of FIG. 1.

FIG. 1 illustrates a configuration of a top surface of a semiconductor device (semiconductor device 1) according to an embodiment of the present disclosure. FIG. 2 illustrates a configuration of a cross section taken along a line II-II of FIG. 1. FIG. 3 illustrates a configuration of a cross section taken along a line III-III of FIG. 1. FIG. 4 illustrates a configuration of a cross section taken along a line IV-IV of FIG. 1. The semiconductor device 1 is packaged with the use of a QFN. In the semiconductor device 1, a semiconductor chip 21 provided on the front surface of a lead frame 10 is covered with a sealing resin 41.

Figure 5A:
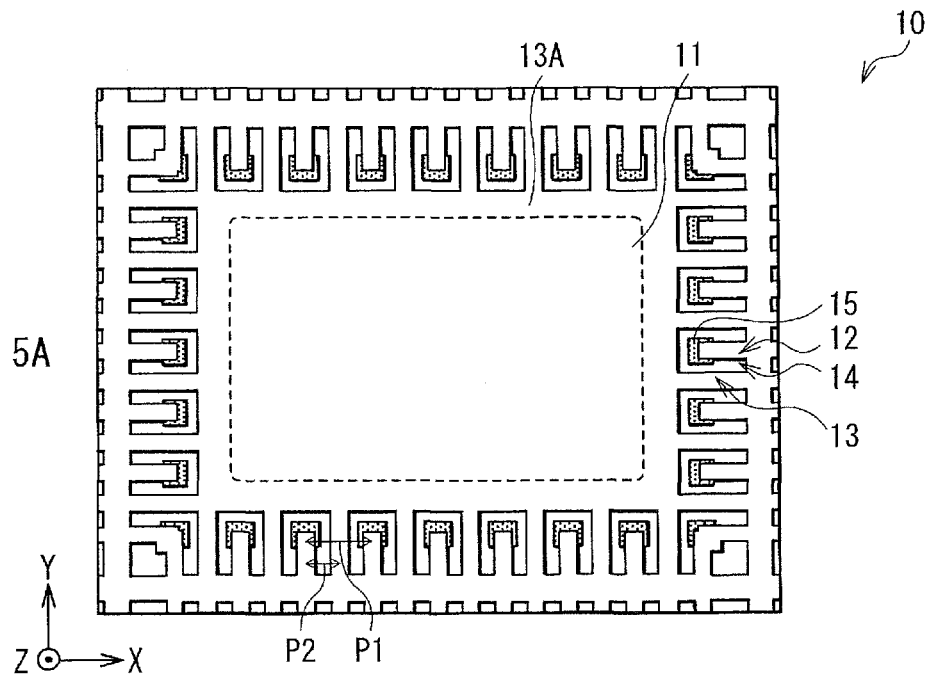
FIGS. 5A and 5B are plan views illustrating a configuration of a lead frame illustrated in FIG. 1.
Figure 5B:
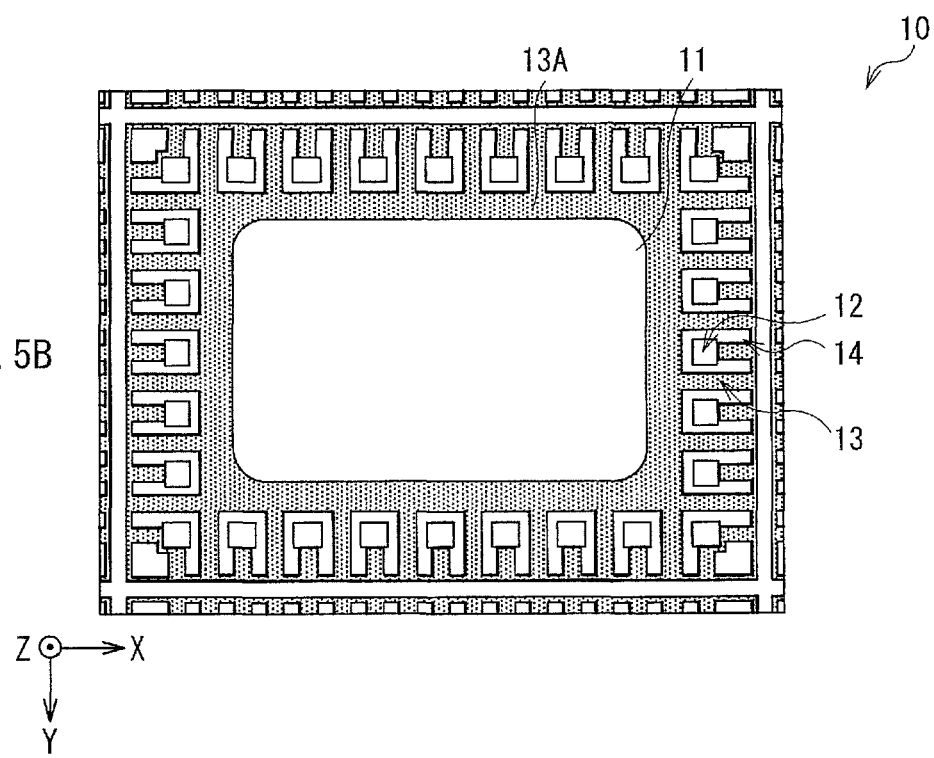

FIG. 5A illustrates a planar configuration of the front surface of the lead frame 10, and FIG. 5B illustrates a planar configuration of the rear surface thereof. Dotted regions in FIGS. 5A and 5B indicate portions thinner than other portions. The thinner portions are created by cawing out a certain amount of the thicknesses from the front surface (FIG. 5A) and the rear surface (FIG. 5B).

The lead frame 10 is made of, for example, plated copper (Cu), and has a chip-mounting region 11 (die pad), a terminal 12 (signal terminal), a lead region 13A, and a gap 14 between the terminal 12 and the lead region 13A. Between the gap 14 and the terminal 12, a flared section 15 (FIG. 2) that supports the terminal 12 is provided. The dotted region of FIG. 5A represents the flared section 15, and the dotted region in FIG. 5B represents the lead region 13A.

The chip-mounting region 11 is provided in the shape of a rectangle in the central portion of the lead frame 10. The lead region 13A is provided around the chip-mounting region 11. The chip-mounting region 11 and the lead region 13A are linked and integrated. The semiconductor chip 21 is mounted on the chip-mounting region 11. The lead region 13A has a plurality of concave and convex sections on the periphery thereof in an in-plane direction of the chip-mounting region 11, and the respective plurality of convex sections are GND leads 13. In this case, the lead region 13A (GND leads 13) is provided on all four sides surrounding the chip-mounting region 11.

The terminals 12 are provided in the respective concave sections of the lead region 13A with the gap 14 in between. The lead region 13A is electrically separated from the chip-mounting region 11. In other words, the terminal 12 is arranged between the GND leads 13 (the convex sections of the lead region 13A). Further, since the lead region 13A exists between the terminal 12 and the chip-mounting region 11, three sides of the terminal 12 are surrounded by the lead region 13A. The terminal 12 is exposed from the sealing resin 41 on the rear surface (FIG. 2), and electrically connected to an electrode pad of the semiconductor chip 21 through a wire 31 (first wiring). Meanwhile, another electrode pad of the semiconductor chip 21 is electrically connected to the GND lead 13 through a wire 31 (second wiring) and is grounded. In other words, the wire 31 that electrically connects the terminal 12 to the semiconductor chip 21 is a signal line, and the wire 31 that electrically connects the GND lead 13 to the semiconductor chip 21 is a GND line. By providing the terminal 12 and the GND lead 13 as described above, even if signals transmitted through the terminal 12 have high frequency, the high frequency signals are isolated from each other, interference between signals is suppressed, and the high frequency characteristics of the semiconductor device 1 are improved. Further, since the GND leads 13 exist between all of the respective terminals 12, the wire 31 is allowed to be connected to any GND lead 13, and wiring freedom degree is improved.

As illustrated in FIG. 4, the terminal 12 has a trapezoidal shape in which the side wall (side surface) in the cross-sectional shape in the arrangement direction (direction in which the terminal 12 is aligned with the GND lead 13) has a curved line. It is to be noted that the side wall may be linear. By forming the cross-sectional shape of the terminal 12 into the shape of a trapezoid, the size of the rear surface of the terminal 12 is secured, and the electric characteristics of the semiconductor device 1 are stabilized.

In the lead frame 10 according to this embodiment, thickness T2 of the lead region 13A from the front surface is smaller than thickness T1 of the terminal 12 from the front surface (FIG. 2 to FIG. 4). For example, in the case where T1 is 0.125 mm, T2 is from about 0.04 to about 0.09 mm both inclusive. By setting the value of the thickness T2 of the lead region 13A to a value smaller than that of the thickness T1 of the terminal 12 as described above, the rear surface of the lead region 13A is covered with the sealing resin 41 (FIG. 3). That is, since the respective GND leads 13 do not have functions as external terminals, a pitch P1 between the terminals 12 (FIG. 5A) is allowed to be decreased. Therefore, the number of external terminals around the semiconductor chip 21 is allowed to be decreased to miniaturize the semiconductor device 1. The pitch P1 is, for example, 0.4 mm, and a pitch P2 between the terminal 12 and the GND lead 13 is, for example, 0.2 mm.

Figure 6:
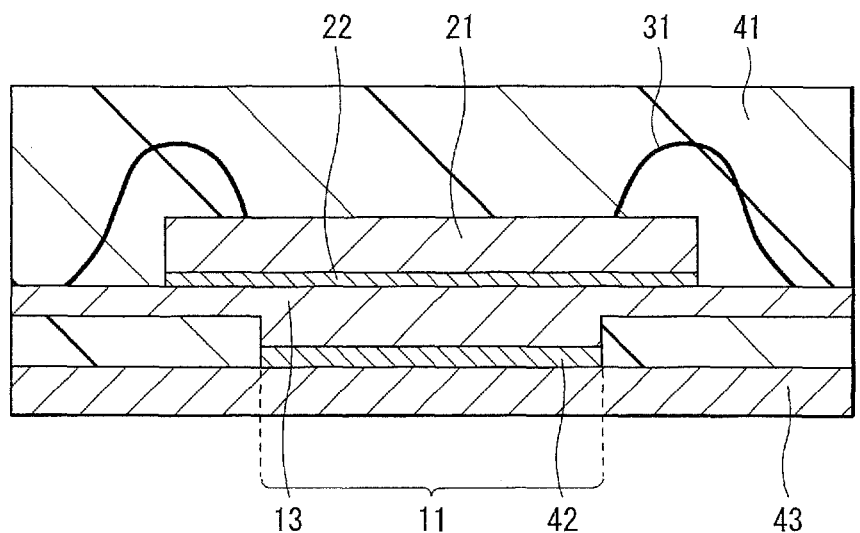
FIG. 6 is a cross-sectional view illustrating an example of a method of mounting the semiconductor device illustrated in FIG. 1.

The lead frame 10 including the lead region 13A as described above is mounted on a mounting substrate 43 with a solder 42 in between, and grounded as illustrated in FIG. 6, for example. That is, the chip-mounting region 11 and the lead region 13A that are integrated as a whole become a GND terminal. At the time of mounting the semiconductor device 1 on the mounting substrate 43, the pitch P1 between the terminals 12 exposed from the sealing resin 41 is larger than the pitch P2 between the terminal 12 in the sealing resin 41 and the GND lead 13 (FIG. 5A). Therefore, the semiconductor device 1 is easily connected to the mounting substrate 43.

Further, in the lead frame 10 according to this embodiment, the lead region 13A is integrated with the chip-mounting region 11. Therefore, its strength is improved, and warpage and deformation are prevented from occurring. In the lead frame 10 in which warpage and deformation are suppressed as described above, its delivery becomes easy. Therefore, the lead frame 10 is allowed to be made of a thin copper foil to improve its yield. Further, since the lead region 13A is integrated with the chip-mounting region 11, the heat radiation area is increased, and the heat radiation characteristics of the semiconductor device 1 are improved. Further, since the lead region 13A is linked to the chip-mounting region 11, the semiconductor chip 21 with a size larger than that of the chip-mounting region 11 is easily mounted. By providing the flared section 15 in the lead frame 10, even if the semiconductor chip 21 with a size larger than that of the chip-mounting region 11 is mounted, miniaturization is achievable while contact between the semiconductor chip 21 and the terminal 12 is prevented, and the size of the terminal 12 is retained.

The semiconductor chip 21 is fixed on the chip-mounting region 11 by an adhesive 22, and its electrode pad is bonded to the respective terminal 12 and GND lead 13 through the wires 31. The semiconductor chip 21 is configured of, for example, a plurality of semiconductor devices such as a vertical NPN transistor (NPN Trs), a vertical PNP transistor (V-PNP Trs), a P-channel MOS transistor (PMOS), an N-channel MOS transistor (NMOS), an MOS capacitance, and a resistance (polysilicon resistance). The wire 31 is made of a conductive metal such as a gold (Au) wire.

The sealing resin 41 seals the semiconductor chip 21 on the lead frame 10. The sealing resin 41 covers the semiconductor chip 21, the wire 31, the front surface of the lead frame 10, and the rear surface of the lead region 13A. The sealing resin 41 is made of an insulative resin such as an epoxy resin.

The semiconductor device 1 may be manufactured, for example, as follows.

Figure 7A:
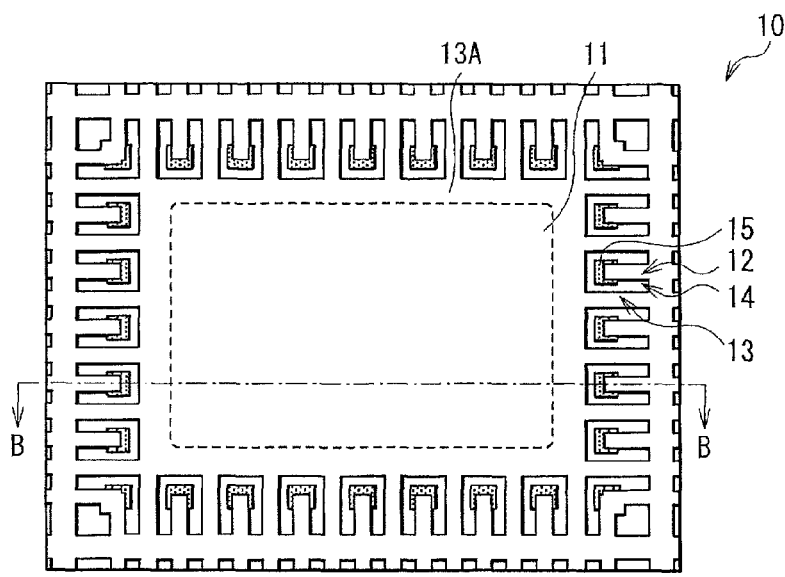
FIG. 7A is a plan view illustrating a method of manufacturing the semiconductor device illustrated in FIG. 1 in order of steps.
Figure 7B:
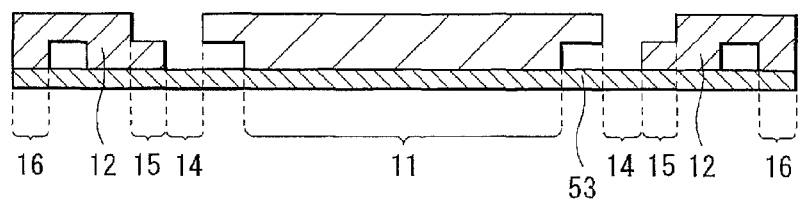
FIG. 7B is a cross-sectional view taken along a line B-B of FIG. 7A.

First, as illustrated in FIGS. 7A and 7B, a tape 53 is bonded to the rear surface of the lead frame 10 that includes the chip-mounting region 11, the terminal 12, the lead region 13A, the gap 14, and the flared section 15. The frame 10 is supported by a supporting section 16 on a lead frame sheet. In forming the sealing resin 41 in a subsequent step, the tape 53 prevents occurrence of resin burr on the rear surface of the lead frame 10, and is made of, for example, a polyimide tape or the like. Forming of the chip-mounting region 11, the terminal 12, the lead region 13A, the gap 14, and the flared section 15 in the lead frame 10 is performed by, for example, patterning a metal plate into a predetermined shape with the use of an appropriate method such as a punching press process and an etching process.

Figure 8A:
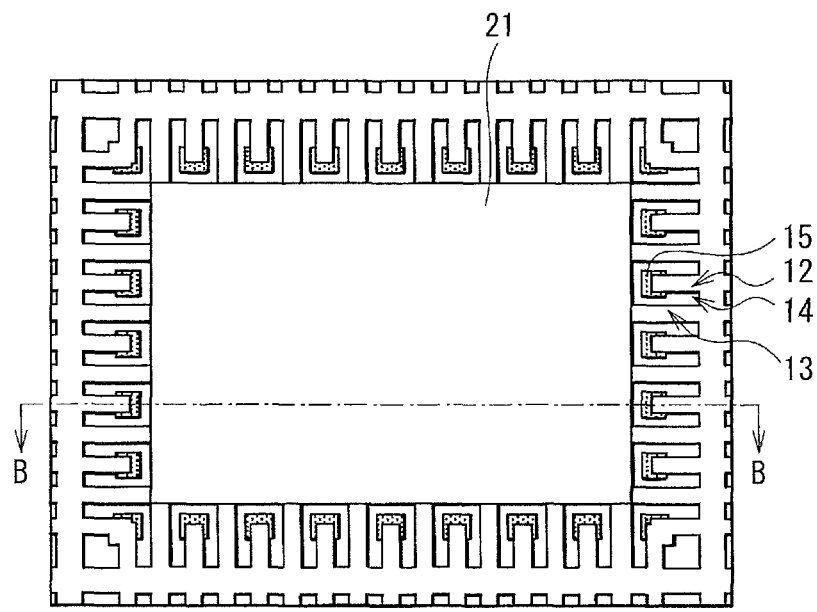
FIG. 8A is a plan view illustrating a step following the step of FIG. 7A.
Figure 8B:
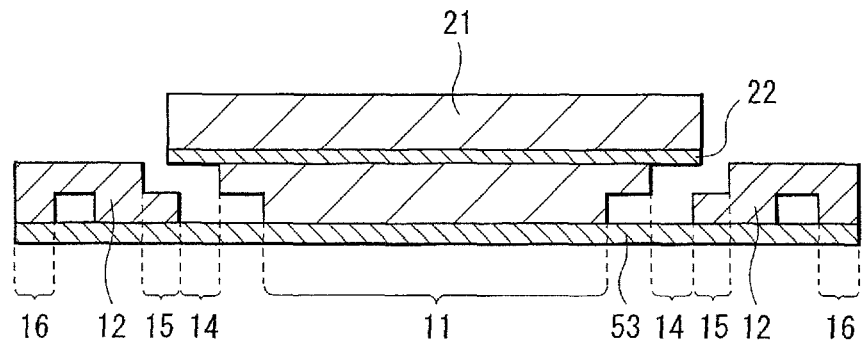
FIG. 8B is a cross-sectional view taken along a line B-B of FIG. 8A.

After the tape 53 is bonded to the lead frame 10, the semiconductor chip 21 is adhered to the chip-mounting region 11 by an adhesive 22 (FIGS. 8A and 8B).

Figure 9A:
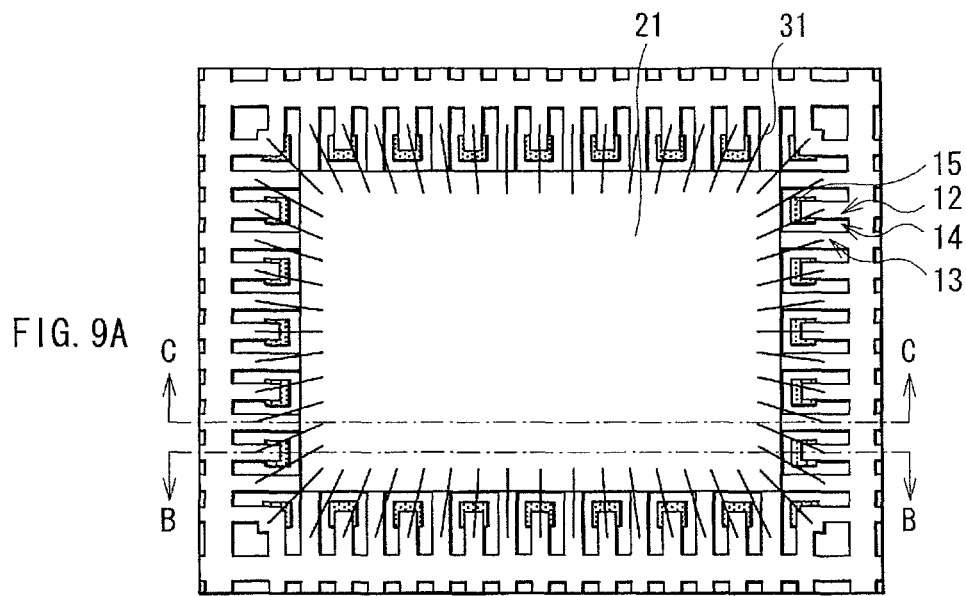
FIG. 9A is a plan view illustrating a step following the step of FIG. 8A.
Figure 9B:
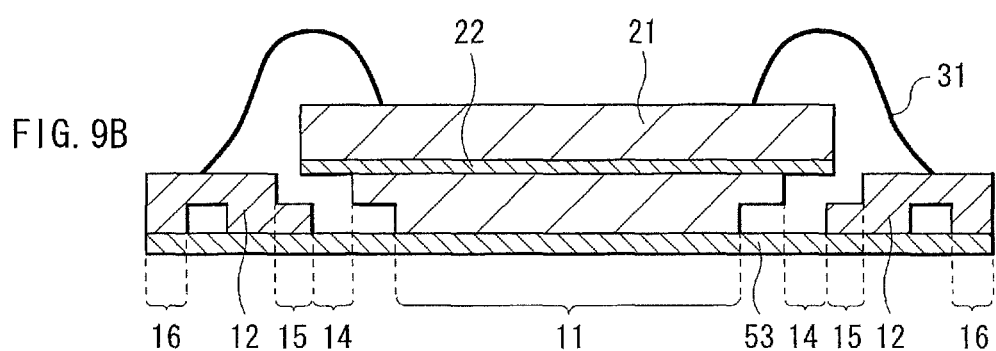
FIG. 9B is a cross-sectional view taken along a line B-B of FIG. 9A.
Figure 9C:
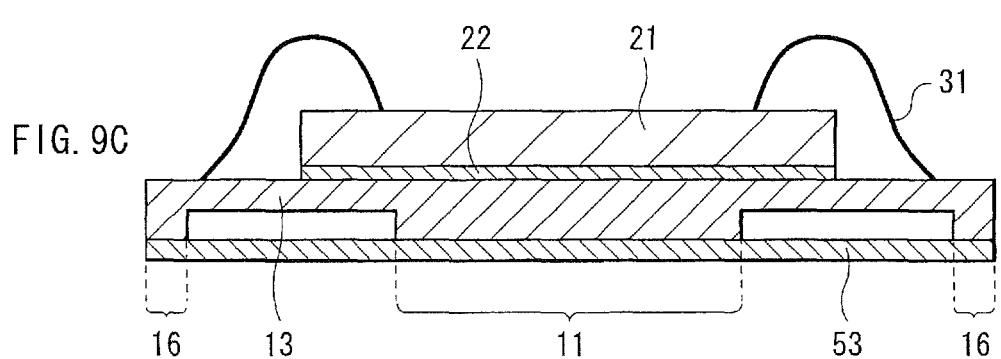
FIG. 9C is a cross-sectional view taken along a line C-C of FIG. 9A.

Next, the electrode pad of the semiconductor chip 21 is electrically connected to the respective terminal 12 and GND lead 13 through the wires 31 (FIGS. 9A to 9C).

Figure 10A:
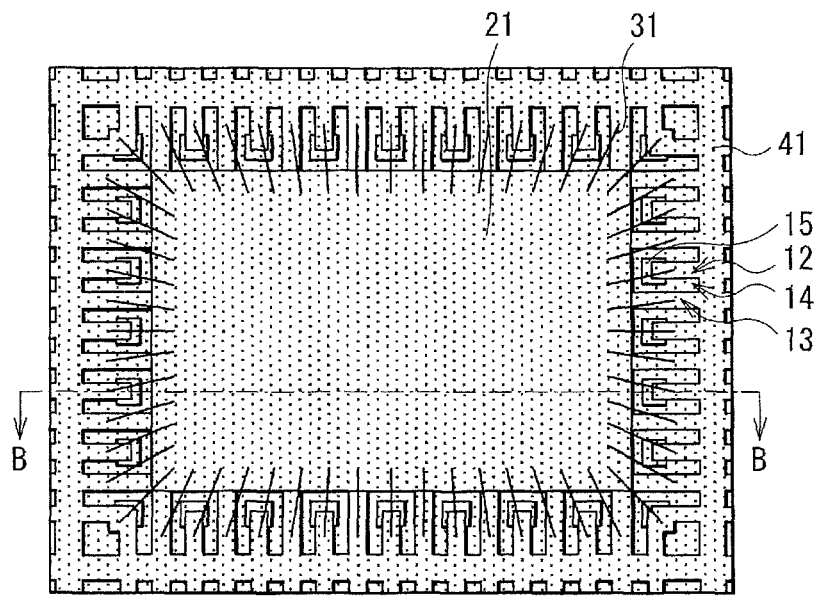
FIG. 10A is a plan view illustrating a step following the step of FIG. 9A.
Figure 10B:
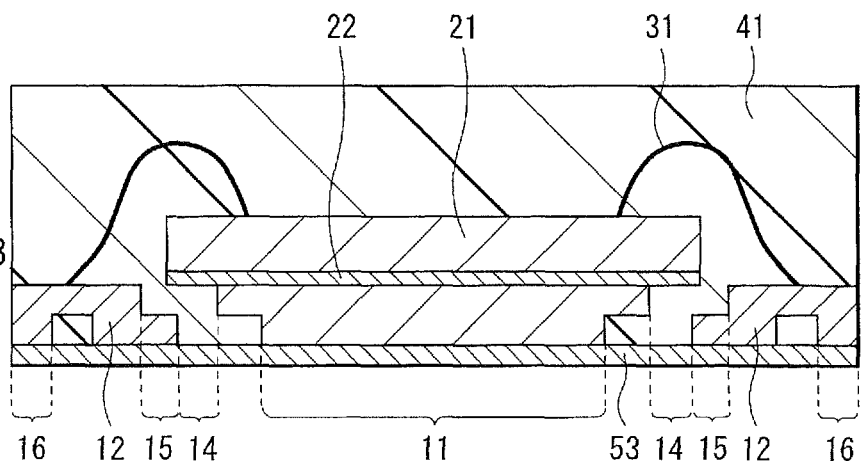
FIG. 10B is a cross-sectional view taken along a line B-B of FIG. 10A.
Figure 11A:
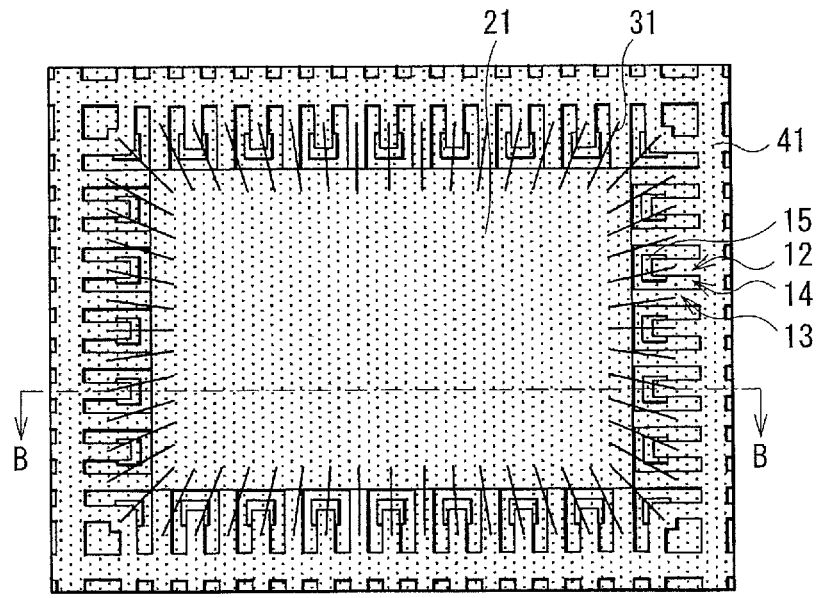
FIG. 11A is a plan view illustrating a step following the step of FIG. 10A.
Figure 11B:
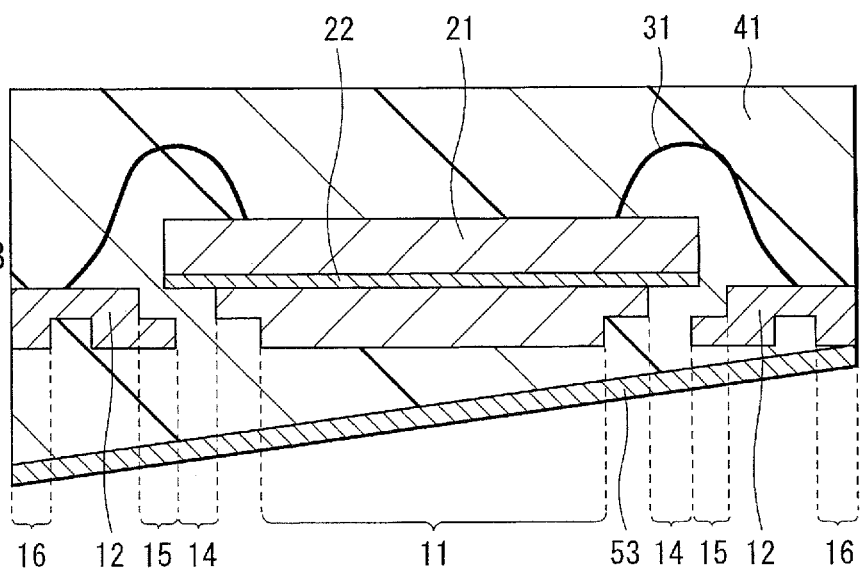
FIG. 11B is a cross-sectional view taken along a line B-B of FIG. 11A.

Subsequently, after the front surface of the lead frame 10, the rear surface of the lead region 13A, the semiconductor chip 21, and the wire 31 are fully covered with the sealing resin 41 (FIGS. 10A and 10B), the tape 53 is exfoliated from the lead frame 10 (FIGS. 11A and 11B).

Figure 12A:
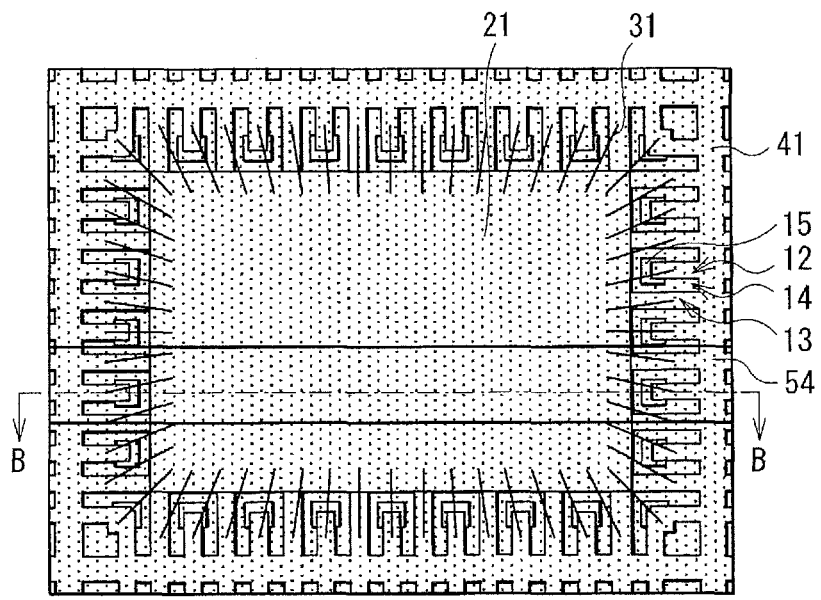
FIG. 12A is a plan view illustrating a step following the step of FIG. 11A.
Figure 12B:
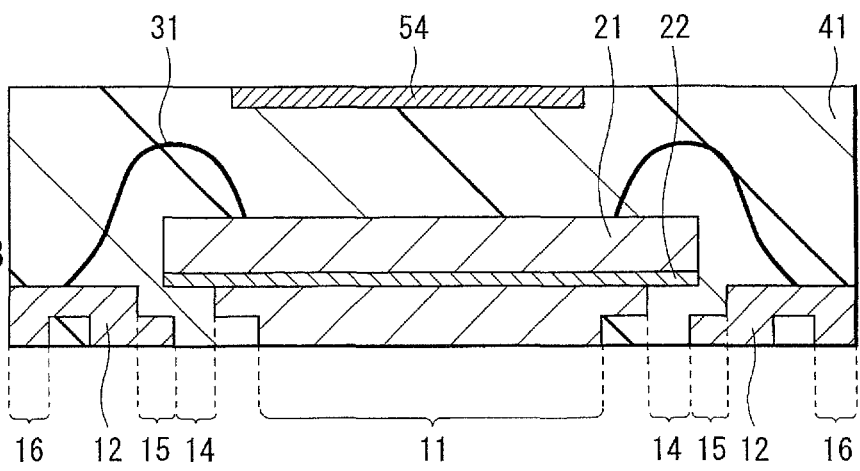
FIG. 12B is a cross-sectional view taken along a line B-B of FIG. 12A.
Figure 13A:
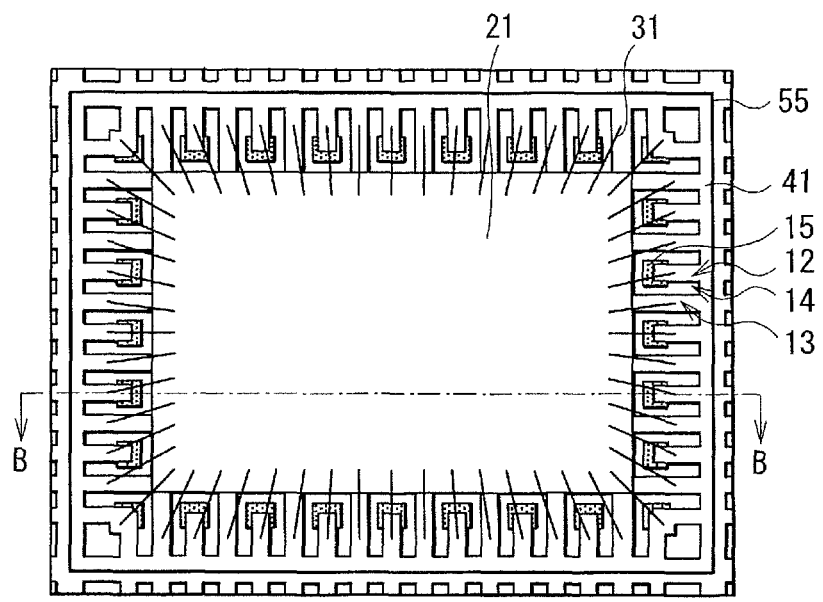
FIG. 13A is a plan view illustrating a step following the step of FIG. 12A.
Figure 13B:
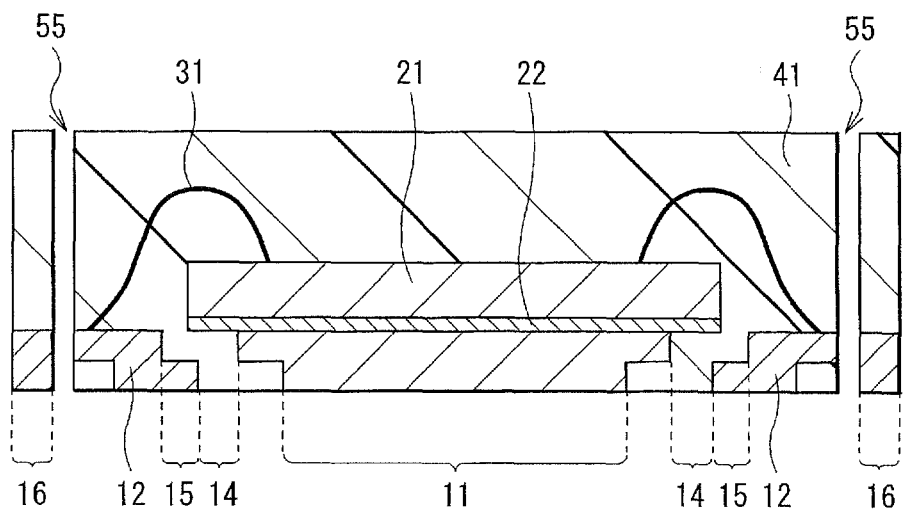
FIG. 13B is a cross-sectional view taken along a line B-B of FIG. 13A.

Subsequently, after a mark 54 with a product name and/or the like is engraved on the surface of the sealing resin 41 (FIGS. 12A and 12B), as illustrated in FIGS. 13A and 13B, the lead frame 10 is cut along a cutting-plane line 55 from the lead frame sheet by a cutter or the like. By the above-described processes, the semiconductor device 1 illustrated in FIG. 1 to FIG. 4 is completed.

In the semiconductor device 1 according to this embodiment, the thickness T2 of the lead region 13A is smaller than the thickness T1 of the terminal 12. Therefore, even if the semiconductor chip 21 is grounded, its package size is miniaturized. A description will be given below in detail of this point by using comparative examples 1 and 2.

Figure 14:
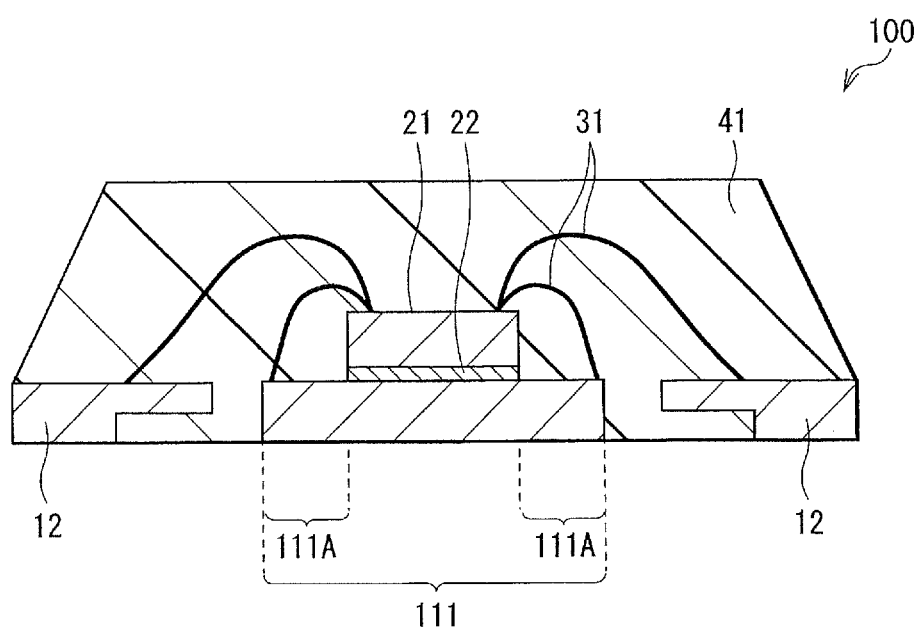
FIG. 14 is a cross-sectional view illustrating a configuration of a semiconductor device according to a comparative example 1.

FIG. 14 illustrates a cross-sectional configuration of a semiconductor device 100 according to the comparative example 1. In the semiconductor device 100, the electrode pad of the semiconductor chip 21 is electrically connected to a chip-mounting region 111 (die pad) through the wire 31, and is grounded. In this case, since a connection region 111A (bonding area) is necessitated in the chip-mounting region 111, the package size of the semiconductor device 100 becomes large. Further, the chip-mounting region 111 is not allowed to be smaller than the semiconductor chip 21.

Figure 15A:
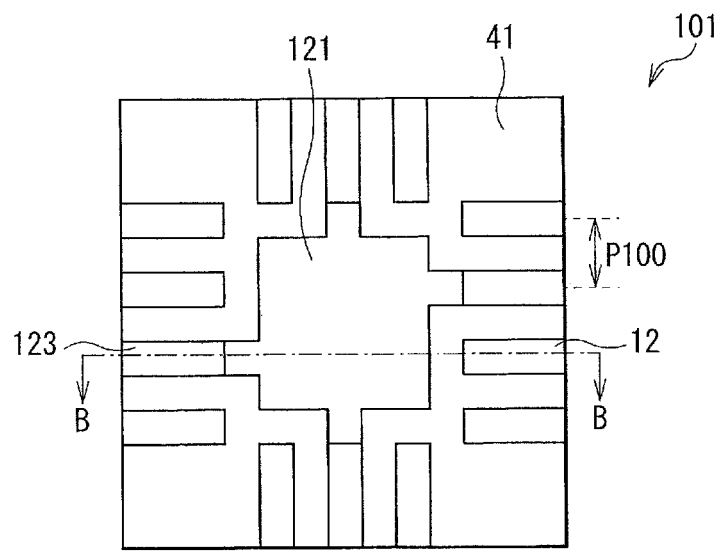
FIGS. 15A and 15B are views illustrating configurations of a semiconductor device according to a comparative example 2.
Figure 15B:
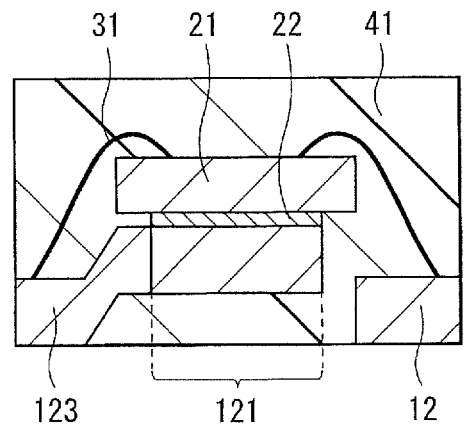

FIGS. 15A and 15B illustrate cross-sectional configurations of a semiconductor device 101 according to the comparative example 2. FIG. 15A illustrates a planar configuration thereof, and FIG. 15B illustrates a configuration of a cross section taken along a line B-B of FIG. 15A. In the semiconductor device 101, the semiconductor chip 21 is grounded by an GND lead 123 integrated with a chip-mounting region 121. However, since the rear surface of the GND lead 123 is exposed from the sealing resin 41, the GND lead 123 functions as an external terminal, and the number of external terminals around the semiconductor chip 21 is increased. That is, pitch P100 between the GND lead 123 and the terminal 12 is not allowed to be decreased, and the package size of the semiconductor device 101 becomes large.

Meanwhile, in the semiconductor device 1, since the thickness T2 of the lead region 13A is smaller than the thickness T1 of the terminal 12, the rear surface of the lead region 13A (GND lead 13) is covered with the sealing resin 41. Thereby, the chip-mounting region 11 and the lead region 13A that are integrated function as a GND terminal. Therefore, the semiconductor chip 21 is grounded without increasing the number of external terminals around the semiconductor chip 21. Further, a connection region is not necessarily provided in the chip-mounting region 11. Accordingly, the semiconductor device 1 is miniaturized.

Further, since the terminal 12 is arranged in the concave section of the lead region 13A, and the terminal 12 is surrounded by the GND lead 13, the high frequency characteristics of the semiconductor device 1 are improved.

Further, since the chip-mounting region 11 and the lead region 13A are integrated, the strength and the heat radiation characteristics of the lead frame 10 are improved. In addition thereto, the semiconductor chip 21 with a size larger than that of the chip-mounting region 11 is easily mounted.

As described above, in this embodiment, the thickness T2 of the lead region 13A is smaller than the thickness T1 of the terminal 12. Therefore, the semiconductor chip 21 is grounded without increasing the number of external terminals around the semiconductor chip 21 or without providing a connection region in the chip-mounting region 11. Accordingly, the semiconductor chip 21 is grounded and the semiconductor device 1 is miniaturized.

A description will be given below of modifications of the foregoing embodiment of the present technology. For the same components as the components of the foregoing embodiment, the same referential symbols are affixed thereto, and the description thereof will be omitted as appropriate.

Modification 1

Figure 16:
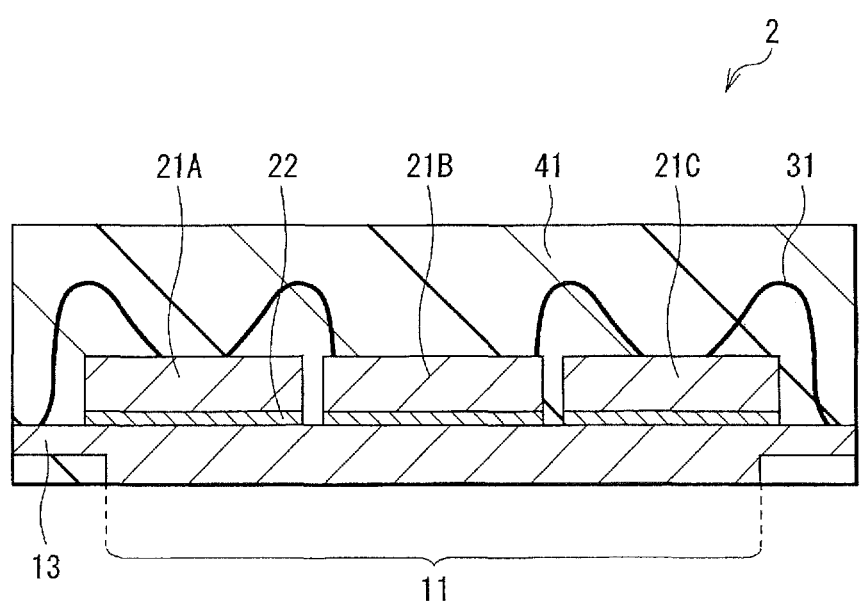
FIG. 16 is a cross-sectional view illustrating a configuration of a semiconductor device according to a modification 1.

FIG. 16 illustrates a cross-sectional configuration of a semiconductor device (semiconductor device 2) according to a modification 1. The semiconductor device 2 is different from the semiconductor device 1 according to the foregoing embodiment in that a plurality of semiconductor chips (semiconductor chips 21A, 21B, and 21C) are provided in one chip-mounting region 11. Except for this point, the semiconductor device 2 has a configuration similar to that of the semiconductor device 1 according to the foregoing embodiment, and its function and its effect are similar to those of the semiconductor device 1 according to the foregoing embodiment.

Electrode pads of the semiconductor chips 21A, 21B, and 21C are electrically connected to each other through the wires 31, and are mounted on the lead frame 10 (chip-mounting region 11). That is, the semiconductor device 2 has what we call a multi-chip configuration.

Modification 2

A semiconductor device (semiconductor device 3) according to a modification 2 has a lead frame 50 provided with a plurality of chip-mounting regions (chip-mounting regions 11A, 11B, and 11C). Except for this point, the semiconductor device 3 has a configuration similar to that of the semiconductor device 1 according to the foregoing embodiment, and its function and its effect are similar to those of the semiconductor device 1 according to the foregoing embodiment.

Figure 17A:
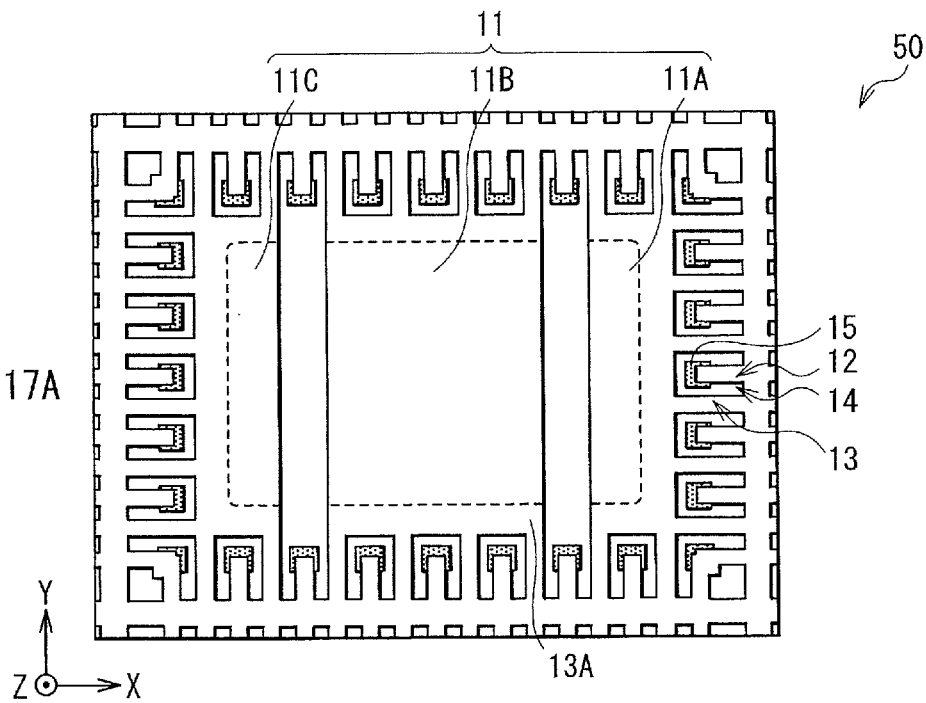
FIG. 17A is a plan view of a front surface illustrating a configuration of a lead frame according to a modification 2.
Figure 17B:
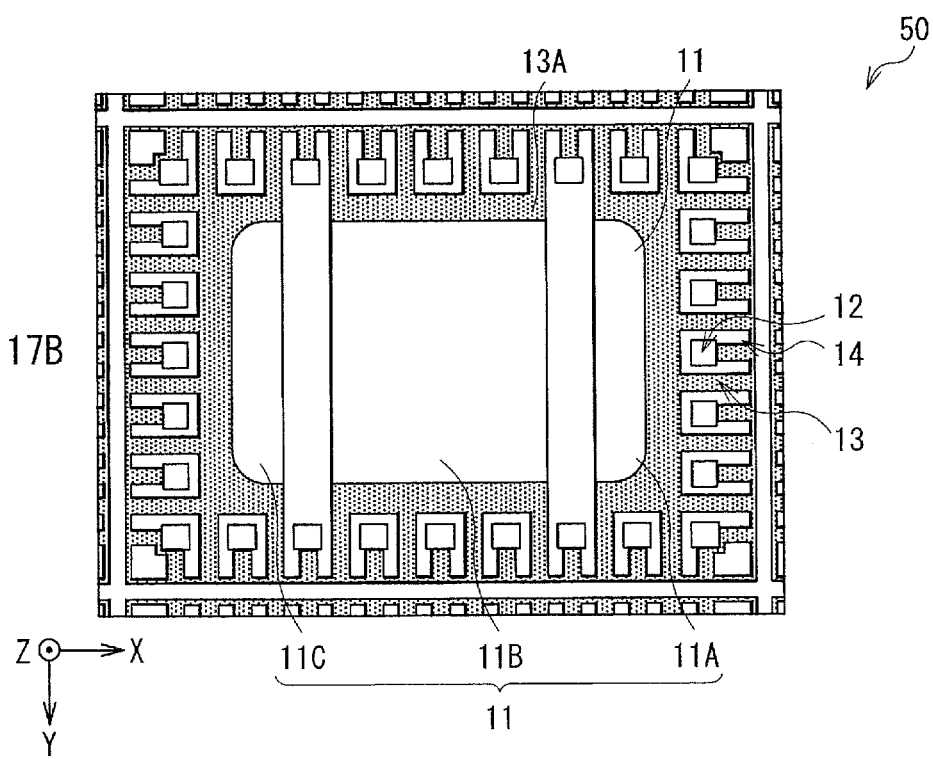
FIG. 17B is a plan view of a rear surface thereof.
Figure 18:
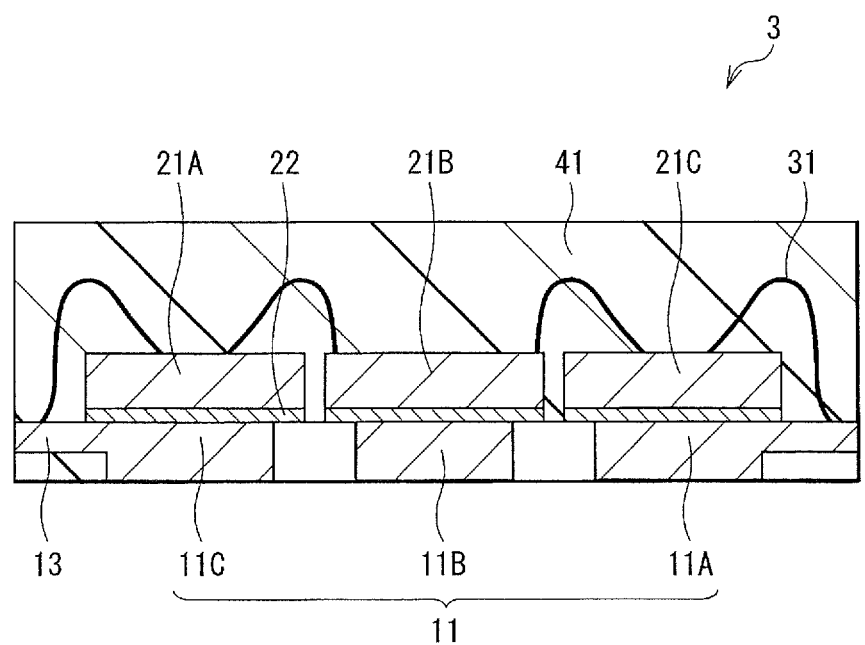
FIG. 18 is a cross-sectional view illustrating a configuration in the case where a semiconductor chip is mounted on the lead frame illustrated in FIGS. 17A and 17B.

As illustrated in FIGS. 17A, 17B, and 18, the lead frame 50 has the three chip-mounting regions 11A, 11B, and 11C separated with a gap in between. The lead region 13A integrated with the respective chip-mounting regions 11A, 11B, and 11C is commonly used, and respective sections thereof are linked to each other. For example, in the case where the plurality of semiconductor chips 21A, 21B, and 21C are mounted on the semiconductor device 3 (FIG. 18), the chip-mounting regions 11A, 11B, and 11C may be separately provided according to each electric power potential. In the lead frame 50, a plurality of GND leads 13 are integrated (lead region 13A), even if the chip-mounting regions 11A, 11B, and 11C are separately provided, the semiconductor chips 21A, 21B, and 21C are allowed to be retained by one lead frame 50.

While the present technology has been described with reference to the embodiment and the modifications, the present technology is not limited to the foregoing embodiment and the like, and various modifications may be made. For example, in the foregoing embodiment, the description has been given of the case in which the lead region 13A is grounded. However, the lead region 13A may be connected to a point having an electric potential other than GND.

Further, while in the foregoing embodiment and the like, the description has been given of the case in which the package of the semiconductor device 1 is the QFN type, a package type other than the QFN type such as an SON type may be used.

Furthermore, the material, the thickness, the forming method, the forming conditions, and the like of each section are not limited to those described in the foregoing embodiment and the like, and other material, other thickness, other forming method, and other forming conditions may be adopted.

It is possible to achieve at least the following configurations from the above-described exemplary embodiment and the modifications of the disclosure.
(1) A lead frame including:
a chip-mounting region provided on a front surface;
a lead region including a plurality of concave and convex sections arranged in an in-plane direction of the chip-mounting region; and
a terminal arranged in the concave section, wherein
a thickness of the lead region from the front surface is smaller than a thickness of the terminal from the front surface.
(2) The lead frame according to (1), wherein the lead region is integrated with the chip-mounting region, and the lead region is electrically separated from the terminal.
(3) The lead frame according to (1) or (2), wherein a shape of a cross section of the terminal is a trapezoidal shape.
(4) The lead frame according to any one of (1) to (3), wherein
the chip-mounting region is provided in a central portion, and the lead region is provided around the chip-mounting region, and
the terminal is arranged in each of all of the concave sections in the lead region.
(5) A semiconductor device including:
a semiconductor chip; and
a lead frame, wherein
the lead frame includes
a chip-mounting region provided on a front surface,
a lead region including a plurality of concave and convex sections arranged in an in-plane direction of the chip-mounting region, and
a terminal arranged in the concave section, and
a thickness of the lead region from the front surface is smaller than a thickness of the terminal from the front surface,
the semiconductor chip is mounted on the chip-mounting region, the semiconductor chip being electrically connected to the terminal through a first wiring and being electrically connected to the lead region through a second wiring.
(6) The semiconductor device according to (5), wherein the semiconductor chip is larger than the chip-mounting region.
(7) The semiconductor device according to (5) or (6), wherein
the front surface of the lead frame and a rear surface of the lead region are covered with a sealing resin, together with the semiconductor chip, and
a rear surface of the terminal is exposed from the sealing resin.
(8) The semiconductor device according to any one of (5) to (7), wherein the semiconductor chip and the lead frame are packaged using a QFN (quad flat non-leaded package).
(9) The semiconductor device according to any one of (5) to (8), wherein the lead region is integrated with the chip-mounting region, and the lead region is electrically separated from the terminal
(10) The semiconductor device according to any one of (5) to (9), wherein the first wiring is a signal line, and the second wiring is a ground (GND) line.
(11) The semiconductor device according to any one of (5) to (10), including a plurality of the semiconductor chips on the single chip-mounting region.
(12) The semiconductor device according to (9) or (10), wherein
the lead frame includes a plurality of chip-mounting regions, the plurality of chip-mounting regions being separated by gaps, and
a lead region is common to the plurality of chip-mounting regions.

The present disclosure contains subject matter related to that disclosed in Japanese Priority Patent Application JP 2011-239444 filed in the Japanese Patent Office on Oct. 31, 2011, the entire contents of which is hereby incorporated by reference.

It should be understood by those skilled in the art that various modifications, combinations, sub-combinations and alternations may occur depending on design requirements and other factors insofar as they are within the scope of the appended claims or the equivalents thereof.

What is claimed is:

1. A lead frame comprising:
   a chip-mounting region, a semiconductor chip being mountable onto a front surface of the lead frame in said chip-mounting region;
   a terminal electrically connectable to said semiconductor chip through a first wire, a gap along an in-plane direction being between said chip-mounting region and said terminal; and
   a lead region electrically connectable to said semiconductor chip through a second wire, said lead region extending in said in-plane direction from said chip-mounting region,
   wherein from said front surface to an opposite surface of the lead frame, a thickness of the lead region at said chip-mounting region is smaller than a thickness of the terminal,
   wherein a shape of a cross section of the terminal is a trapezoidal shape, said cross section of the terminal being wider at said opposite surface than at said front surface.

2. The lead frame according to claim 1, wherein said lead frame comprises copper.

3. The lead frame according to claim 1, wherein a portion of the gap is between said terminal and said lead region.

4. The lead frame according to claim 1, wherein said terminal includes a flared section.

5. The lead frame according to claim 1, wherein said first wire is a conductive metal, said second wire being said conductive metal.

6. The lead frame according to claim 5, wherein said conductive metal is gold.

7. A semiconductor device comprising:
   the lead frame according to claim 1;
   the semiconductor chip, said semiconductor chip being affixed to said lead frame.

8. The semiconductor device according to claim 7, wherein said lead region is electrically separated from said terminal.

9. The semiconductor device according to claim 7, wherein said first wiring is a signal line and said second wiring is a ground line.

10. The semiconductor device according to claim 7, wherein said first wire electrically connects said terminal to said semiconductor chip.

11. The semiconductor device according to claim 7, wherein said second wire electrically connects said lead region to said semiconductor chip.

12. The semiconductor device according to claim 7, wherein said semiconductor chip has an area larger than said chip-mounting region.

13. The semiconductor device according to claim 7, wherein said semiconductor chip and said lead frame are packaged using a quad flat non-leaded package.

14. The lead frame according to claim 7, wherein a sealing resin covers said semiconductor chip, said sealing resin covering said front surface and said opposite surface.

15. The lead frame according to claim 7, wherein a sealing resin covers said semiconductor chip, said sealing resin covering said front surface and said opposite surface.

16. The semiconductor device according to claim 7, wherein said lead frame includes a plurality of chip-mounting regions, one of chip-mounting regions being separated from another of the chip-mounting regions.

17. The semiconductor device according to claim 16, wherein said chip-mounting region is said one of chip-mounting regions.

* * * * *